United States Patent
Fan et al.

(10) Patent No.: US 12,015,246 B2
(45) Date of Patent: Jun. 18, 2024

(54) VERTICAL CAVITY SURFACE EMITTING LASER AND CORRESPONDING FABRICATING METHOD

(71) Applicant: SUZHOU HANHUA SEMICONDUCTOR CO., LTD., Jiangsu (CN)

(72) Inventors: Qian Fan, Jiangsu (CN); Xianfeng Ni, Jiangsu (CN); Bin Hua, Jiangsu (CN); Ying Cui, Jiangsu (CN)

(73) Assignee: SUZHOU HANHUA SEMICONDUCTOR CO., LTD., Jiangsu (CN)

( * ) Notice: Subject to any disclaimer, the term of this patent is extended or adjusted under 35 U.S.C. 154(b) by 476 days.

(21) Appl. No.: 17/338,155

(22) Filed: Jun. 3, 2021

(65) Prior Publication Data
US 2021/0384705 A1    Dec. 9, 2021

(30) Foreign Application Priority Data
Jun. 5, 2020    (CN) .......................... 202010499463.2

(51) Int. Cl.
*H01S 5/183*    (2006.01)
*H01S 5/042*    (2006.01)
*H01S 5/20*    (2006.01)

(52) U.S. Cl.
CPC ...... *H01S 5/18308* (2013.01); *H01S 5/04252* (2019.08); *H01S 5/18369* (2013.01); *H01S 5/18377* (2013.01); *H01S 5/209* (2013.01)

(58) Field of Classification Search
CPC ........ H01S 5/0201–0206; H01S 5/0215–0217; H01S 5/05; H01S 5/0208–021
See application file for complete search history.

(56) References Cited

U.S. PATENT DOCUMENTS

| | | | | |
|---|---|---|---|---|
| 6,121,068 A | * | 9/2000 | Ramdani | H01S 5/1838 438/39 |
| 6,277,696 B1 | * | 8/2001 | Carey | H01S 5/1838 438/246 |

(Continued)

FOREIGN PATENT DOCUMENTS

| | | |
|---|---|---|
| CN | 1622410 A | 6/2005 |
| CN | 101667716 A | 3/2010 |

(Continued)

OTHER PUBLICATIONS

First Office Action dated Oct. 12, 2020, issued in counterpart of CN Patent Application No. 202010499463.2 (10 pages).

(Continued)

*Primary Examiner* — Tod T Van Roy
*Assistant Examiner* — Fernanda Adriana Camacho Alanis
(74) *Attorney, Agent, or Firm* — WHDA, LLP (57) ABSTRACT

A method of fabricating vertical cavity surface emitting laser, comprising: providing a first substrate formed with a dielectric DBR and a first bonding layer, and a second substrate formed with a etch-stop layer, a heavily doped layer, an active region, a current-confinement layer, and an arsenide DBR firstly, then sticking a third substrate on the arsenide DBR, then removing the second substrate and the etch-stop layer, next bonding the heavily doped layer to the dielectric DBR, next removing the third substrate, finally forming a p-type electrode contact and an n-type electrode contact.

19 Claims, 8 Drawing Sheets

(56) References Cited

U.S. PATENT DOCUMENTS

| | | | | |
|---|---|---|---|---|
| 2004/0096996 A1* | 5/2004 | Cheng | ................ | H01S 5/18305 438/22 |
| 2023/0008483 A1* | 1/2023 | Watanabe | ........... | H01S 5/18377 |

FOREIGN PATENT DOCUMENTS

| | | |
|---|---|---|
| CN | 110600994 A | 12/2019 |
| WO | 2019/070719 A1 | 4/2019 |

OTHER PUBLICATIONS

Second Office Action dated Jan. 8, 2021, issued in counterpart of CN Patent Application No. 202010499463.2 (14 pages).

* cited by examiner

VERTICAL CAVITY SURFACE EMITTING LASER AND CORRESPONDING FABRICATING METHOD

CROSS-REFERENCE TO RELATED APPLICATIONS

This application claims benefit of the filing date of Chinese Patent Application No. 202010499463.2 filed on Jun. 5, 2020, the disclosure of which is hereby incorporated in its entirety by reference.

TECHNICAL FIELD OF THE INVENTION

This disclosure generally relates to the technical field of semiconductor manufacturing, and more particularly to a Vertical Cavity Surface Emitting Laser and corresponding fabricating method.

BACKGROUND OF THE INVENTION

Semiconductor lasers mainly have two types, namely edge emitting and vertical emitting lasers, which depend on whether the laser emission direction is parallel or perpendicular to the substrate. A vertical cavity surface emitting laser (VCSEL) typically has distributed Bragg reflector (DBR) on both upper and lower sides of the active region. The reflector is formed by interleaved semiconductor layers, which is quarter wavelength thick at the wavelength (in the medium) of interest. By controlling the growth of epitaxial materials, one can adjust the reflectivity of DBRs to make the cavity resonance happened in the vertical direction. The VCSEL has been widely used in the field of optical fiber communication, 3D sensing, time-of-flight (TOF) measurement etc, because of its high coupling efficiency, low threshold currents and operating power consumption, superior reliability and wafer-level manufacturing process capability.

However, due to the opaque substrate, the emission direction of most VCSELs is away from the substrate, thereby increasing the difficulty in the semiconductor process to couple the laser from a flip chip packaging.

SUMMARY OF THE INVENTION

This disclosure describes a novel vertical cavity surface emitting laser diode structure and the method of fabricating such. It utilizes dielectric layers instead of semiconductors to form either p- or n-DBR in conventional VCSEL. The half-stack VCSEL structure and the dielectric DBR are integrated together by bonding technology. In this way, the epitaxy process time is drastically reduced. Also, it allows the opaque GaAs substrate to be replaced with other infrared transparent materials, which pave the way to wafer level integration of III-V laser to Si photonic chips.

This disclosure provides a method of fabricating vertical cavity surface emitting laser: a first substrate stacked with a dielectric DBR and a first bonding layer on the top is provided, a second substrate that has been epitaxially grown with a etch-stop layer, a heavily doped layer, an active region consists of cladding layers and multi-quantum wells, a current-confinement layer and an arsenide DBR sequentially; a third substrate is then glued it to the second substrate on the epitaxy side by a temporary bonding process; the second substrate is then removed by wafer thinning and wet etching process and stopped on the etch-stop layer, which also will be etched completely to expose the heavily doped layer; a second bonding layer is deposited to cover the heavily doped layer and the surface is prepared for van der Waals direct bonding; after the first substrate and the third substrate are bonded by combining bonding layers on each side together, the third substrate is also removed to expose the arsenide DBR; co-planar mesa diode device could then be fabricated by p-type electrode contact formation, mesa etching till the heavily doped layer, and n-type electrode contact deposition on the bottom wall of the mesa.

The first substrate may be one from sapphire, silicon, glass, ceramic or silicon carbide. The dielectric DBR may be fabricated on those substrates. The dielectric DBR is comprised of first dielectric layers and second dielectric layers, and the first dielectric layer and the second dielectric layer are alternately stacked to obtain the dielectric DBR. The material of the first dielectric layer is different from that of the second dielectric layer, both of which could be chosen from $SiO_2$, $Si_3N_4$, $TiO_2$, $Al_2O_3$, or $Ta_2O_5$.

The arsenide DBR is comprised of first arsenide layers and second arsenide layers, and the first arsenide layer and the second arsenide layer are alternately stacked to obtain the arsenide DBR. The material of the first arsenide layer is different from that of the second arsenide layer that could be chosen from AlAs, GaAs, AlGaAs, or InGaAs.

In one embodiment, the material of the heavily doped layer includes n-type AlGaAs, InGaAlP or InP. The thickness of the heavily doped layer is in the range of 1 μm to 3 μm. The doping concentration in such layer reaches $10^{18}$ cm-3 or more to ensure adequate current spreading when n-contact electrode is laid down.

One embodiment is to etch the mesa with a certain depth during device fabrication. In a preferred embodiment, the etching is done with inductively coupled plasma dry etching method, in chlorine based chemistry. The etching penetrates through the arsenide DBR, the current-confinement layer, the active region and stops on the heavily doped layer to form a mesa. To ensure the completely opening of the heavily doped layer over the entire wafer substrate, over-etching is often needed while the removal of the heavily doped layer is no greater than 0.3 μm. After etching, the current-confinement layer 240 needs to be partially oxidized to form aperture.

The laser emission direction in one embodiment may be either up, meaning originated from active region towards arsenide DBR, or down meaning towards dielectric DBR, depending on the reflectivity of each DBR. The reflectivity can be adjusted by changing layer thickness and composition.

When the reflectivity of the arsenide DBR is set higher than that of the dielectric DBR, the VCSEL emits laser light from the side of the first substrate. In one embodiment, the p-type electrode sitting on the top of the mesa can cover the majority of the plateau area.

Alternatively, when the reflectivity of the dielectric DBR is set higher than that of the arsenide DBR, the VCSEL emits laser light away from the first substrate. Consequently, the p-type electrode sitting on top of the mesa needs to have a center opening to allow laser pass through.

In one embodiment, the material of the p-type electrode contact is in the form of metal alloy from two or more metal elements of Ni, Pt, Au, and Ti.

This disclosure provides a vertical cavity surface emitting laser. The VCSEL comprises a first substrate, a dielectric DBR covering the first substrate, a combined bonding pair and a heavily doped layer covering the dielectric DBR, wherein a device mesa is formed including the heavily doped layer, an active region, a current-confinement layer and an arsenide DBR, a p-type electrode contact is located on top of the arsenide DBR and an n-type electrode contact is located on the bottom part of the mesa on the heavily doped layer.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION

Figure 1:
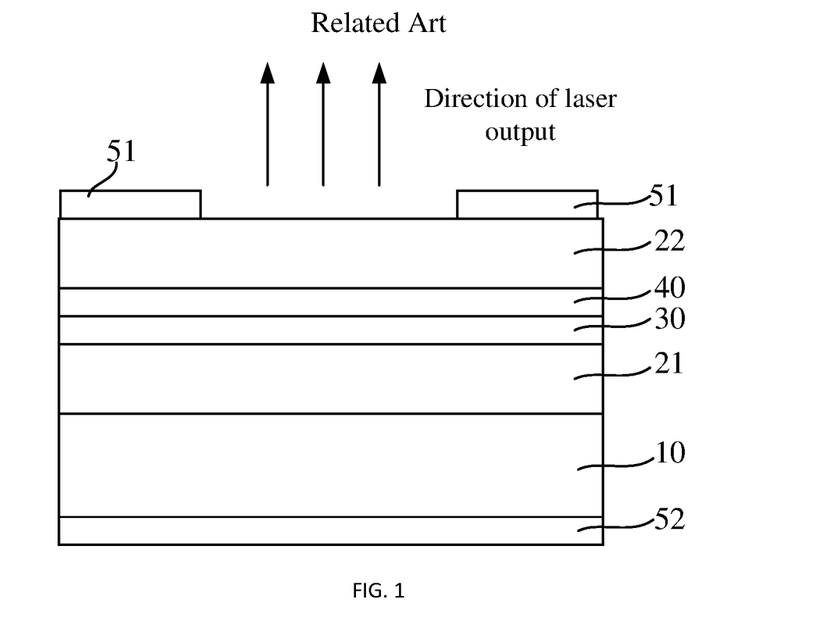
FIG. 1 illustrates a VCSEL structure based on GaAs material system.

FIG. 1 illustrates a VCSEL structure based on GaAs material system. The VCSEL structure includes an n-type contact electrode 52, a GaAs substrate 10, a n-type DBR 21, an active region 30, a current-confinement layer 40, a p-type DBR 22 and a p-type contact electrode 51 stacked in sequence, the n-type DBR 21 and the p-type DBR 22 can generally be composed of dozens of pairs of thin layers with high/low refractive index, such as AlGaAs/GaAs or AlAs/GaAs, etc. In order to ensure the high reflectivity of the DRRs the refractive index and thickness uniformity of the layers need to be precisely controlled. The thickness of the DBR 21 and DBR 22 are at least several micron meters, leading the total epitaxy layer thickness to be 10 or more micron meters. VCSEL structure is usually grown by metal organic chemical vapor deposition (MOCVD) or molecular beam epitaxy (MBE) method, and the growth of the DBRs usually take up to 70% or more of the total growth time. The large epi thickness can cause poor uniformity, low yield and high manufacturing cost. Recent progress in Si photonics, furthermore, requires the VCSELs to be efficiently wafer level integrated with waveguide, couplers and resonators with minimum loss.

Figure 2:
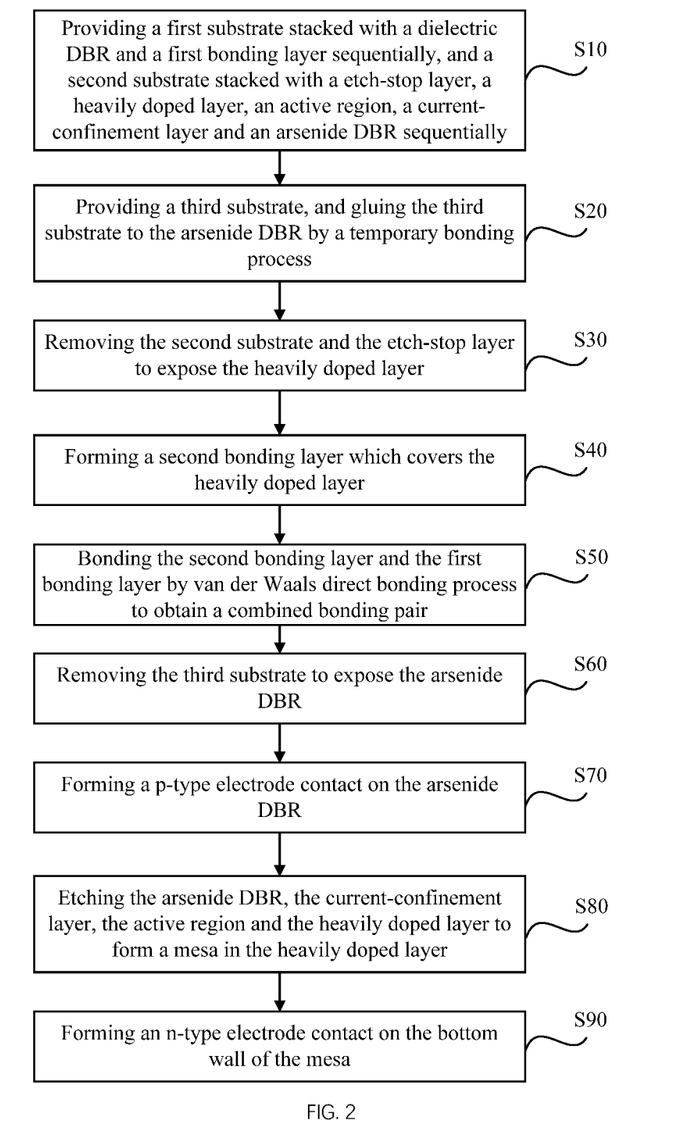
FIG. 2 illustrates a flow chart of a method of fabricating Vertical Cavity Surface Emitting Laser.

Referring to FIG. 2, this disclosure provides a vertical cavity surface emitting laser, comprising:

S10: providing a first substrate whose surface stacks a dielectric DBR and a first bonding layer sequentially and a second substrate whose surface stacks a etch-stop layer, a heavily doped layer, an active region, a current-confinement layer and an arsenide DBR sequentially;

S20: providing a third substrate, and gluing the third substrate to the arsenide DBR by a temporary bonding process;

S30: removing the second substrate and the etch-stop layer to expose the heavily doped layer;

S40: forming a second bonding layer which covers the heavily doped layer;

S50: bonding the second bonding layer and the first bonding layer together by van der Waals direct bonding process to obtain a combined substrate pair;

S60: removing the third substrate by debonding process to expose the arsenide DBR;

S70: forming a p-type electrode contact on the arsenide DBR;

S80: etching the area that is not covered by p-type electrode to remove the arsenide DBR, the current-confinement layer, the active region and part of the heavily doped layer to form a mesa;

S90: forming an n-type electrode contact on the bottom part of the mesa on heavily doped layer.

Please refer to FIG. 3-FIG. 13, FIG. 3-FIG. 13 illustrate process of fabricating a Vertical Cavity Surface Emitting Laser described in one embodiment.

Figure 3:
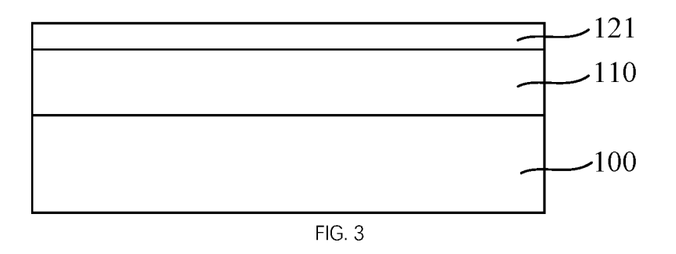
FIG. 3-FIG. 13 illustrate different semiconductor structures in each step of fabricating a Vertical Cavity Surface Emitting Laser.
Figure 4:
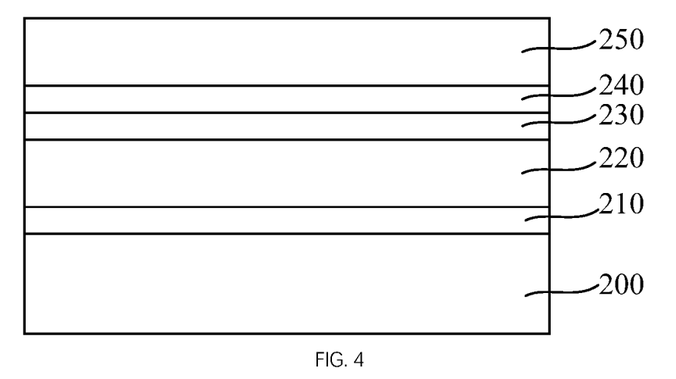

A first substrate 100 and a second substrate 200 are provided, a dielectric DBR 110 and a first bonding layer 121 are stacked on the first substrate 100 sequentially, and an etch-stop layer 210, a heavily doped layer 220, an active region 230, a current-confinement layer 240 and an arsenide DBR 250 are stacked on the second substrate 200 sequentially. The first substrate 100 can be sapphire, silicon, glass, ceramic substrate or silicon carbide. Preferably, the thermal expansion coefficient of the first substrate 100 is close to that of the arsenide material, although this disclosure does not limit the material of the first substrate 100. In this embodiment, the arsenide DBR 250 is a p-type doped. The dielectric DBR 110 comprises a interleave stack of first and second dielectric layers, which have different thickness and refraction index. In this embodiment, the first dielectric layer and the second dielectric layer are alternately grown on the substrate 100 by chemical vapor deposition (CVD) process or physical vapor deposition (PVD) process to form the dielectric DBR 110, for example, plasma enhanced chemical vapor deposition (PECVD), low pressure chemical vapor deposition (LPCVD), ultra high vacuum chemical vapor deposition (UHVCVD) or dielectric sputtering process, etc. The material of the first and second dielectric layer can be choose from $SiO_2$, $Si_3N_4$, $TiO_2$, $Al_2O_3$ or $Ta_2O_5$. Preferably, the dielectric DBR 110 can be formed by dozens of pairs of $SiO_2/Si_3N_4$ or $TiO_2/SiO_2$ stacked alternately. A thickness of the both dielectric layer is in the range of 50 nm to 300 nm. The CVD or PVD deposited dielectric DBR has advantages on deposition rate, thickness uniformity and compatibility large wafer size Si process, over traditional MOCVD or MBE method. By depositing dielectric DBR directly on CMOS wafer, it allows convenient integration of VCSEL laser diode on large-scale CMOS integrated circuit to fulfill novel silicon photonic chips.

In one embodiment, the material of the first bonding layer 121 is one of $SiO_2$, $Si_3N_4$, $TiO_2$, $Al_2O_3$ or $Ta_2O_5$, and the deposition of the first bonding layer 121 is the same as that of the dielectric DBR 110. The thickness of the first bonding layer 121 is less than or equal to 0.3 µm. Preferably, in one embodiment, a sapphire substrate is selected as the first substrate 100 as the carrier of the device, because of its good optical transparency and matching on the thermal expansion coefficient with GaAs which allows high temperature semiconductor process after bonding. By dividing the DBRs into two separated process on different wafers, it is also expected that the process difficulties in epitaxy can be reduced, and the yield of the production can be improved as well.

On top of the second substrate 200 which is GaAs, the deposited etch-stop layer 210 is composed of III-V compounds quaternary alloy, such as InGaAlP, whose thickness is usually no more than 1.0 µm. The heavily doped layer 220 can be n-type doped AlGaAs, InGaAlP, InP, etc. Preferably, the silicon doping concentration in layer 220 is in the range of 1E18 atoms/cm3 to 1E 20 atoms/cm3, and the thickness is 1 µm to 3 µm. Layer 220, 230 and 240 can be epitaxially growth, which is not limited by this disclosure. The arsenide DBR 250 is an interleaved layer stack choosing from AlAs, GaAs, AlGaAs or InGaAs, etc. Preferably, it can be formed by dozens of pairs of AlAs/GaAs or AlGaAs/GaAs stacked alternately. The dielectric DBR 110 is directly grown on the first substrate 100, the arsenide DBR 250 is formed on the second substrate 200, and the final VCSEL is obtained by a bonding process, which can not only reduce the difficulty of epitaxy but also enhance the working wavelength range of VCSEL.

Figure 5:
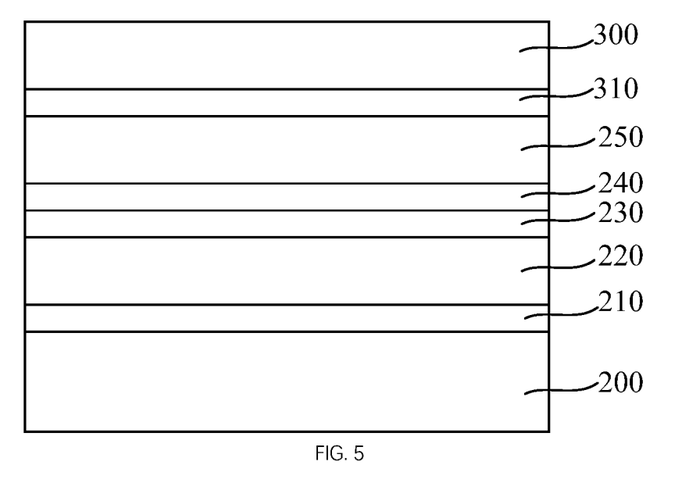

Then referring to FIG. 5, a third substrate 300 is provided and glued to the arsenide DBR 250 by a temporary bonding process. The substrate 300 can be regarded as a temporary carrier in this embodiment which can be a silicon or a sapphire substrate. Temporary bonding layer 310 is usually spin coated on both surfaces of the third substrate 300 and arsenide DBR 250. After proper thermal compressive treatment, the third substrate 300 can be smoothly adhered to the arsenide DBR 250 to formed the bonded pair.

Figure 6:
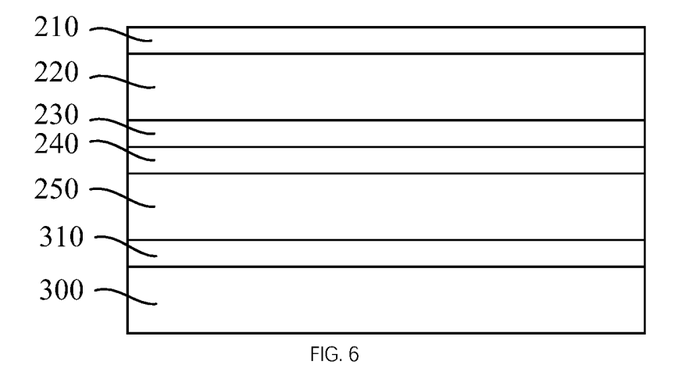
Figure 7:
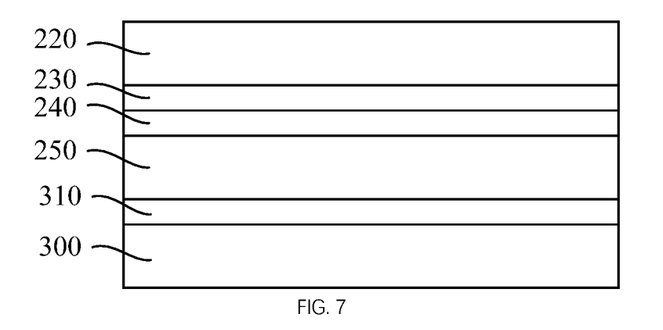

Next, referring to FIG. 6 and FIG. 7, the second substrate 200 and the etch-stop layer 210 are removed and the heavily doped layer is exposed. Substrate 200 is firstly thinned by mechanical grinding or lapping process to remove majority of its bulk material. Preferably, the remaining thickness of substrate 200 is in the range of 20 µm to 50 µm. Secondly, the remaining substrate 200 is completely removed by a wet etching process that stops on layer 210. The wet etching process is usually done in a solution with PH value greater than 7. In this embodiment, the etch-stop layer 210 also needs to be removed by either plasma dry etching or chemical mechanical polishing (CMP) or the combined methods, to expose the heavily doped layer 220.

Figure 8:
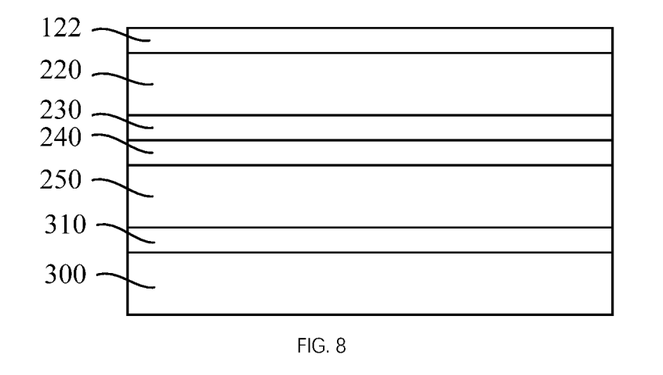

Next, referring to FIG. 8, a second bonding layer 122 which covers the heavily doped layer 220 is deposited with same material property and thickness as layer 121. The growth process of the second bonding layer 122 can either CVD or PVD. The surface of both layer 121 and 122 needs to be treated, by CMP and cleaning process, to obtain atomic level roughness to ensure direct bonding.

Figure 9:
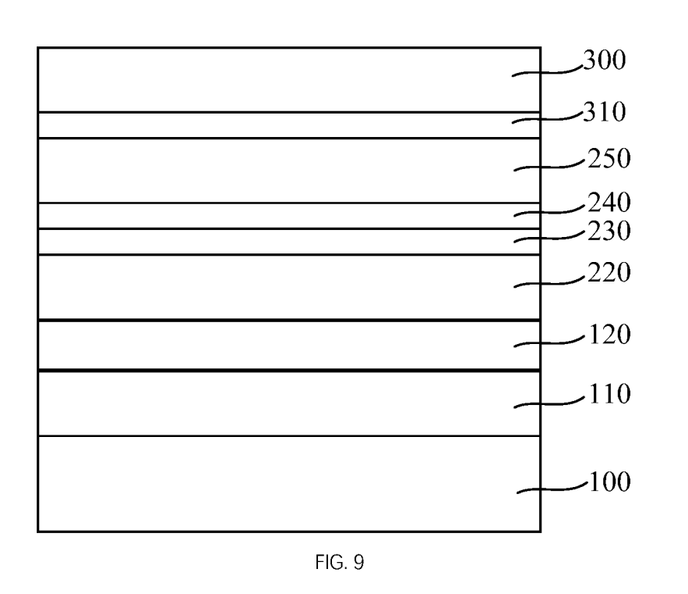

Referring to FIG. 9, the first substrate 100 and third substrate 300 are bonded together with all other layers sandwiched in between. The second bonding layer 122 and the first bonding layer 121 are joined together by van der Waals force to obtain a combined bonding pair 120. Preferably, the bonded pair need low temperature annealing to enhance the bonding strength.

Figure 10:
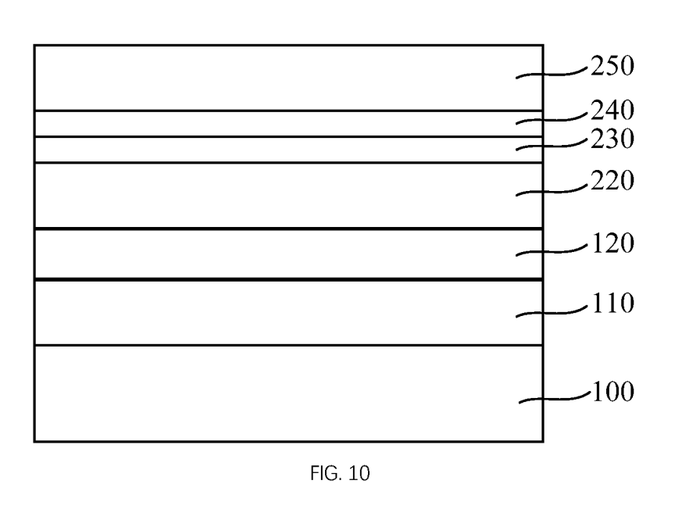

Referring to FIG. 10, the third substrate 300 is debonded and the arsenide DBR 250 is exposed. In this embodiment, the third substrate 300 can be separated by either laser stripping, shearing force sliding or chemical solvent dissolving, and then the residual bonding material layer 310 on the surface of the arsenide DBR 250 is removed by wet cleaning process.

Figure 11:
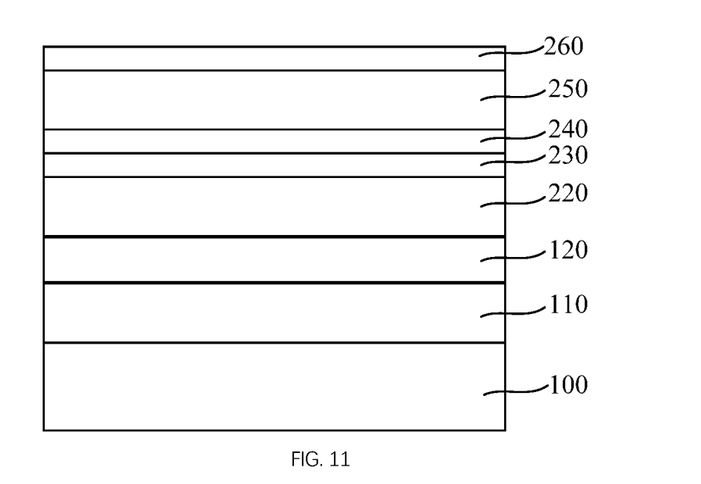
Figure 13:
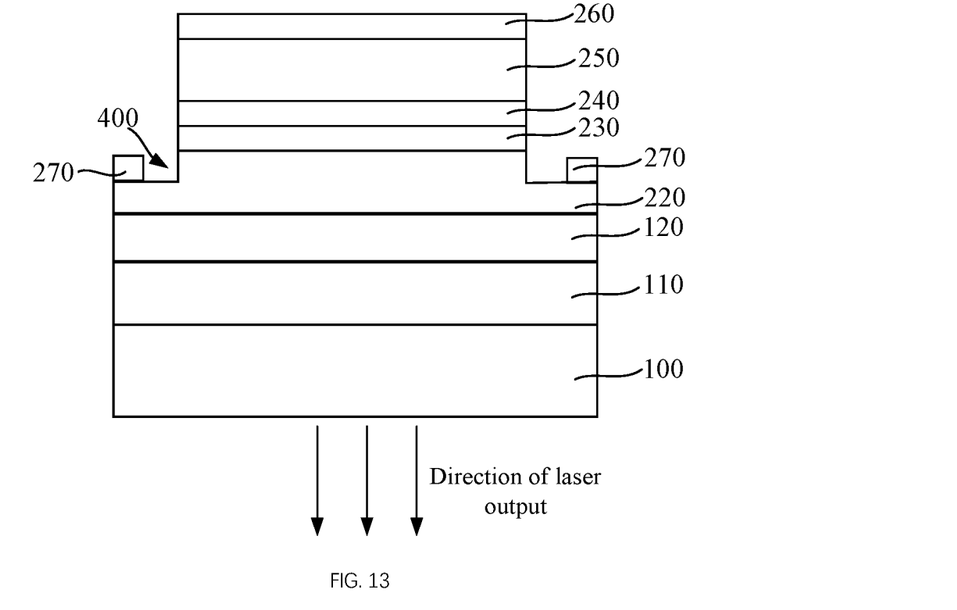
Figure 14:
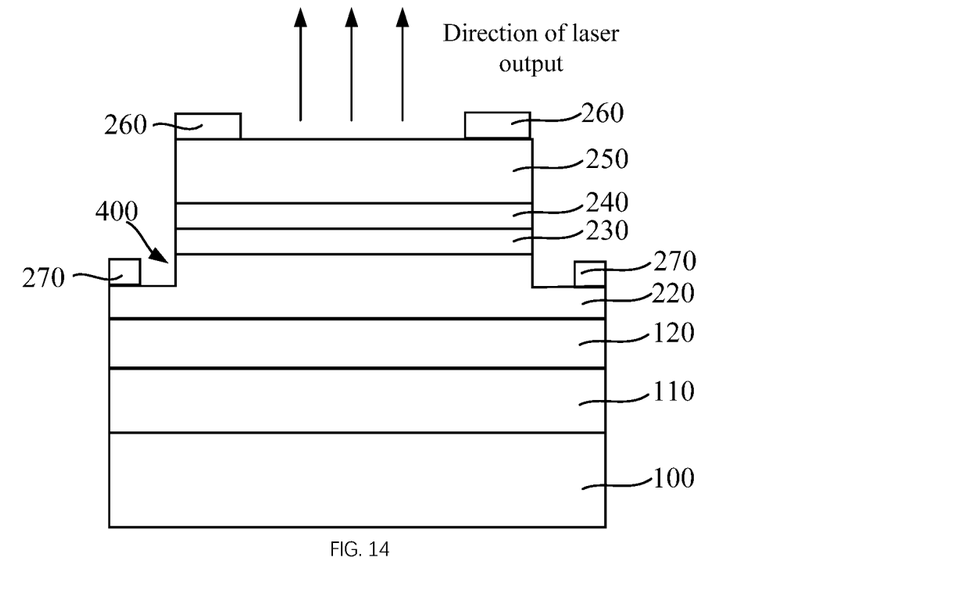
FIG. 14 illustrates an alternative Vertical Cavity Surface Emitting Laser.

Referring to FIG. 11, a p-type electrode contact 260 is formed on the arsenide DBR 250. A material of the p-type electrode contact 260 usually includes an alloy of two or more metal elements of Ni, Pt, Au, Ti, etc., to form p-type ohmic contact towards arsenide semiconductor. The formation of the p-type electrode contact 260 generally requires a photolithography process and a metal lift-off process. As shown in FIG. 13 and FIG. 14, the p-type electrode contact 260 can have different metal patterns depending on laser emission directions. Specifically, it can be either a full coverage closed pattern or ring shape pattern with a center opening.

Figure 12:
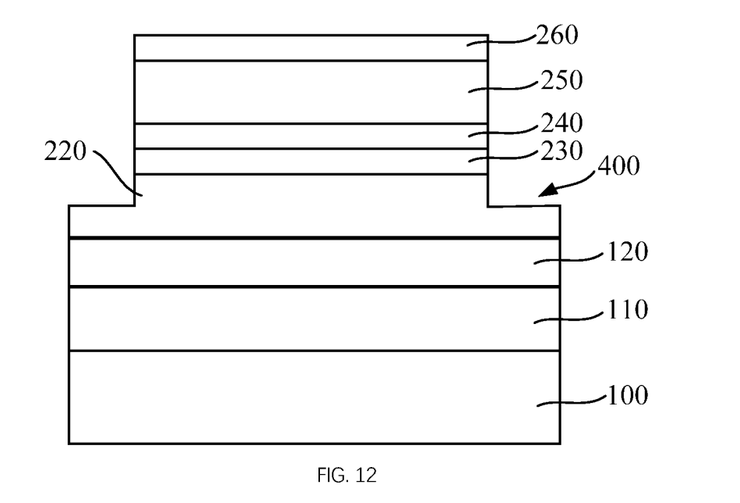

Referring to FIG. 12, outside of the p-type contact 260, the arsenide DBR 250, the current-confinement layer 240, the active region 230 are etched to form a mesa 400 and stopped in the heavily doped layer 220. In this embodiment, the etching process can be a plasma dry etching process using chlorine chemistry. When stopped on the heavily doped layer 220, the thickness of over-etching into this layer is less than or equal to 0.3 µm. After etching, the current-confinement layer 240 needs to be partially oxidized to form an aperture.

Finally, referring to FIG. 13, an n-type electrode contact 270 is formed on the bottom part of the mesa. The n-type electrode contact 270 forms n-type ohmic contact towards layer 220, and a material of the n-type electrode contact 270 usually includes an alloy of two or more metal elements in Ni, Ge, Au, Ti, etc.

FIG. 13 illustrates one example of Vertical Cavity Surface Emitting Laser structure mentioned above. One can choose optical transparent substrate 100 to allow laser emission originating from active region 230 towards dielectric DBR 110. The p-type electrode 250 can be a closed pattern on top of mesa 400. Further, the reflectivity of the arsenide DBR 250 is higher than that of the dielectric DBR 110 by adjusting the thickness and/or composition of both DBRs.

FIG. 14 illustrates another example of Vertical Cavity Surface Emitting Laser structure mentioned above. Like conventional VCSELs, its emission direction is originating from active region 230 towards arsenide DBR 110. The p-type electrode contact 260 contains center opening, and the reflectivity of the arsenide DBR 250 is set lower than that of the dielectric DBR 110.

Figure 15:
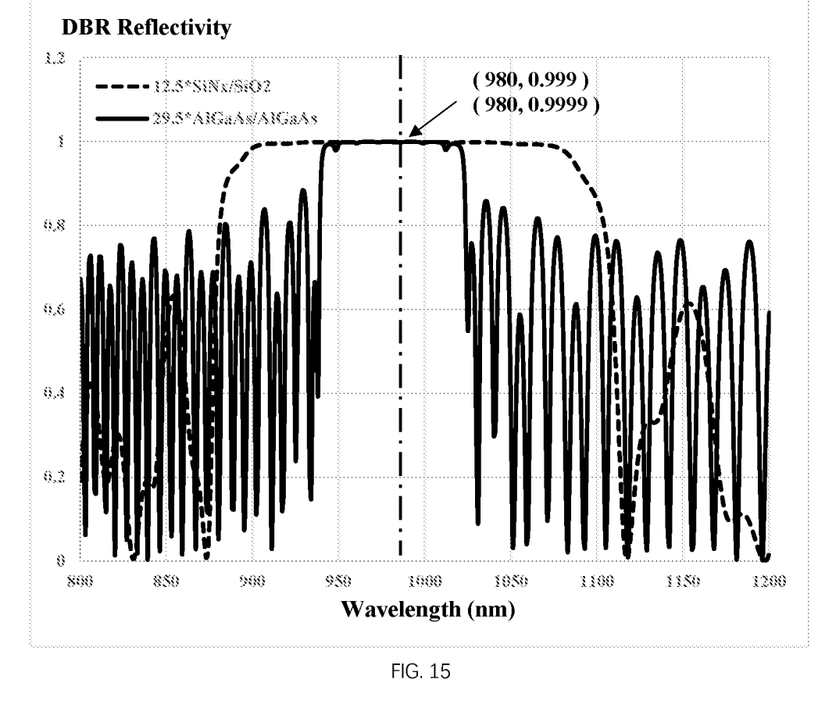
FIG. 15 illustrates reflectivity of dielectric DBR and arsenide DBR.

FIG. 15 illustrates one example of reflectivity achieved from dielectric DBR and arsenide DBR at laser wavelength of 980 nm. In this embodiment, the arsenide DBR 250 composed of 29.5 pairs of AlGaAs/AlGaAs with a thickness of 70.8 nm/81 nm (for example, Al0.12Ga0.88As/Al0.9Ga0.1As) and the dielectric DBR 110 composed of 12.5 pairs of SiNx/SiO2 with a thickness of 122.5 nm/167.8 nm. FIG. 15 shows the reflectivity distribution of the dielectric DBR and the arsenide DBR in the wavelength range of 800 nm-1200 nm. The reflectivity of the arsenide DBR 250 is set as a solid line, the reflectivity of the dielectric DBR 110 is set as a dotted line. As one can see, at the central wavelength 980 nm, the reflectivity of the arsenide DBR 250 is 99.99%, and the reflectivity of the dielectric DBR 110 is 99.90%. In this case, the structure of the VCSEL can take the form shown in FIG. 13, and the VCSEL emits laser light from the side of the first substrate 100.

What is claimed:

1. A method of fabricating vertical cavity surface emitting laser, comprising:
    providing a first substrate stacked with a dielectric distributed Bragg reflector (DBR) and a first bonding layer sequentially, and a second substrate stacked with a etch-stop layer, a heavily doped layer, an active region, a current-confinement layer and an arsenide DBR sequentially;
    providing a third substrate, and gluing the third substrate to the arsenide DBR by a temporary bonding process;
    removing the second substrate and the etch-stop layer to expose the heavily doped layer;
    forming a second bonding layer which covers the heavily doped layer;
    bonding the second bonding layer and the first bonding layer by van der Waals direct bonding process to obtain a combined bonding pair;
    removing the third substrate to expose the arsenide DBR;

forming a p-type electrode contact on the arsenide DBR;

etching the arsenide DBR, the current-confinement layer, the active region and the heavily doped layer to form a mesa in the heavily doped layer;

forming an n-type electrode contact on the bottom wall of the mesa.

2. The method of fabricating vertical cavity surface emitting laser of claim 1, wherein the first substrate includes sapphire, silicon, glass, ceramic or silicon carbide substrate.

3. The method of fabricating vertical cavity surface emitting laser of claim 1, wherein the dielectric DBR comprises an interleave stack of first dielectric layers and second dielectric layers.

4. The method of fabricating vertical cavity surface emitting laser of claim 3, wherein a material of the first dielectric layers is different from that of the second dielectric layers.

5. The method of fabricating vertical cavity surface emitting laser of claim 3, wherein a material of the first dielectric layers includes $SiO_2$, $Si_3N_4$, $TiO_2$, $Al_2O_3$ or $Ta_2O_5$.

6. The method of fabricating vertical cavity surface emitting laser of claim 3, wherein a material of the second dielectric layers includes $SiO_2$, $Si_3N_4$, $TiO_2$, $Al_2O_3$ or $Ta_2O_5$.

7. The method of fabricating vertical cavity surface emitting laser of claim 1, wherein the arsenide DBR comprises an interleave stack of first arsenide layers and second arsenide layers.

8. The method of fabricating vertical cavity surface emitting laser of claim 7, wherein a material of the first arsenide layers is different from that of the second arsenide layers.

9. The method of fabricating vertical cavity surface emitting laser of claim 7, wherein a material of the first arsenide layers includes AlAs, GaAs, AlGaAs or InGaAs.

10. The method of fabricating vertical cavity surface emitting laser of claim 7, wherein a material of the second arsenide layer includes AlAs, GaAs, AlGaAs or InGaAs.

11. The method of fabricating vertical cavity surface emitting laser of claim 1, wherein a material of the heavily doped layer includes n-type AlGaAs, InGaAlP or InP.

12. The method of fabricating vertical cavity surface emitting laser of claim 1, wherein a thickness of the heavily doped layer is in the range of 1 μm to 3 μm.

13. The method of fabricating vertical cavity surface emitting laser of claim 1, wherein when etching the arsenide DBR, the current-confinement layer, the active region and the heavily doped layer to form a mesa, a thickness of over-etching into the heavily doped layer is less than or equal to 0.3 μm.

14. The method of fabricating vertical cavity surface emitting laser of claim 1, wherein patterns of the p-type electrode contact include closed patterns or center opening patterns.

15. The method of fabricating vertical cavity surface emitting laser of claim 14, wherein a reflectivity of the dielectric DBR is set differently from a reflectivity of the arsenide DBR.

16. The method of fabricating vertical cavity surface emitting laser of claim 15, wherein the patterns of the p-type electrode contact are the closed patterns, the reflectivity of the arsenide DBR is set higher than that of the dielectric DBR, and the vertical cavity surface emitting laser emits laser light from the side of the first substrate.

17. The method of fabricating vertical cavity surface emitting laser of claim 15, wherein the patterns of the p-type electrode contact are the center opening patterns, the reflectivity of the dielectric DBR is set higher than that of the arsenide DBR, and the vertical cavity surface emitting laser emits laser light from the side of the arsenide DBR.

18. The method of fabricating vertical cavity surface emitting laser of claim 1, wherein a material of the p-type electrode contact includes an alloy of two or more metal elements of Ni, Pt, Au and Ti.

19. The method of fabricating vertical cavity surface emitting laser of claim 1, wherein a material of the n-type electrode contact includes an alloy of two or more metal elements in Ni, Ge, Au and Ti.

* * * * *